United States Patent [19]

Weckenmann et al.

[11] 4,016,490
[45] Apr. 5, 1977

[54] CAPACITATIVE PROXIMITY SENSING SYSTEM

[75] Inventors: Albert Weckenmann, Ahrensburg; Lothar Haas, Siegelsdorf; Rolf Bräutigam, Nurnberg, all of Germany

[73] Assignee: Robert Bosch G.m.b.H., Stuttgart, Germany

[22] Filed: Dec. 3, 1975

[21] Appl. No.: 637,181

[30] Foreign Application Priority Data

Dec. 19, 1974  Germany ............... 2460057

[52] U.S. Cl. .................. 324/61 R; 200/DIG. 1; 324/61 P; 340/365 C; 361/178
[51] Int. Cl.[2] ..................... G01R 27/26
[58] Field of Search ............ 324/61 R, 61 P; 200/DIG. 1; 317/246, DIG. 2; 340/258 B, 258 C, 365 C; 235/92 P; 328/5

[56] References Cited
UNITED STATES PATENTS

| 3,039,051 | 6/1962 | Locher | 324/61 R |
| 3,046,479 | 7/1962 | Mead et al. | 324/61 R |
| 3,515,987 | 6/1970 | Zurbrick et al. | 324/61 R |
| 3,727,113 | 4/1973 | Weber | 317/DIG. 2 X |
| 3,728,501 | 4/1973 | Larson et al. | 200/DIG. 1 X |
| 3,811,087 | 5/1974 | Schmeizer | 324/61 P X |
| 3,826,979 | 7/1974 | Steinmann | 324/61 R |

Primary Examiner—Stanley T. Krawczewicz
Attorney, Agent, or Firm—Flynn & Frishauf

[57] ABSTRACT

A leakage field capacitor has two adjacently located surface electrodes placed on an essentially plane support surface. A signal source is connected to one of the electrodes, so that this electrode, which may then be termed the transmitting electrode, will provide an electrical field which is sensed by the other, receiving electrode, which is connected to an evaluation circuit which evaluates disturbance of the field generated by the transmitting electrode. A metallic shield which is electrically floating i.e., is galvanically isolated with respect to the electrodes is connected to the signal source as well as to the evaluation circuit in such a manner as to draw off a portion of the field generated by the transmitting electrode when a mass connected to a terminal of the electrodes — for example ground of chassis — approaches the shield to cause an increase in leakage field being drawn off by the shield and thereby provide a positive signal indication; the grounded mass may, for example, be the finger of a user operating a switch.

8 Claims, 3 Drawing Figures

CAPACITATIVE PROXIMITY SENSING SYSTEM

The present invention relates to a capacitative proximity sensing system, and more particularly to a proximity switching arrangement.

It has previously been proposed to control electrical switching by arranging surface electrodes in a plane in which one electrode is connected to a signal source to provide radiated signals which are received by the other electrode. When a user or operator who wishes to operate the switch approaches the electrodes, the change in field between the electrodes results in a signal which can be sensed and evaluated to effect switching.

Switches of this type have been used for various applications. One application which has been proposed is to automatically switch windshield wipers of automotive vehicles ON; in such an arrangement, the electrodes are located on one side of the windshield (see U.S. Pat. No. 3,826,979). The electrodes are connected to form capacitor electrodes; the dielectric between the electrodes is provided by the windshield itself. A high-frequency signal is applied to one of the electrodes which, for simplicity, may be termed the transmitting electrode. A portion of the field will include the other electrode, for simplicity called the receiving electrode. Moisture on the windshield causes an increase in the coupling effected by the field, so that the field reaching the receiving electrode is enhanced. Only a small quantity of moisture is needed to change the signal received by the receiving electrode. The change in field, actually the change in field lines or field distribution, is evaluated as a sensing signal, controlling the windshield wiper system to switch the windshield wipers ON. Such switching arrangements cannot be used to connect or disconnect headlights, warning blinkers, horns, or other individually controllable loads in an automotive vehicle, since they require moisture for a switching signal. If finger-operated, they would require moistening of the finger. Erroneous switching could be triggered, for example if the switching electrodes are subjected to dew deposition.

It has also been proposed to arrange electrodes forming capacitor electrodes as a contactless proximity sensor by placing a third electrode which is grounded in the vicinity of the transmitting, or receiving electrode, respectively, in in order to draw off a portion of the field reaching the receiving electrode. The amplitude of the original signal received by the receiving electrode then decreases; this effect can be used to control any load. This solution has a disadvantage in that deposition of dirt, moisture, or other contamination on any one, or both of the electrodes causes such an increase in the current sensed by the receiving electrode that approach of the mass electrode will no longer draw off a sufficient field to cause an easily distinguished sensing signal. Such an arrangement, therefore, is not reliable in operation.

It is an object of the present invention to provide a proximity-sensitive sensor, and more particularly, a switching arrangement based thereon which is essentially independent of deposit of dirt, or moisture, and which provides an output signal with high reliability, for example to unambiguously trigger a switching operation.

SUBJECT MATTER OF THE PRESENT INVENTION

Briefly, the electrodes are surrounded by a metallic shield which is galvanically insulated therefrom, and galvanically insulated with respect to the electrodes and ground or chassis as well, so that the shield, electrically, is floating. The shield is so arranged that a portion of the field lines of the transmitting electrodes, due to the field generated by the transmitting electrode, is conducted to the receiving electrode. When a grounded mass, for example the finger of a user, approaches or touches the shield, then a portion of the field being transmitted through the shield is drawn off, resulting in a clearly discernible signal.

When no field is drawn off, for example when the shield is not touched by the finger of the user, a definite received signal will appear at the receiving electrode. This received signal is essentially independent of moisture, dirt, or other contamination at the outside of the shield. With respect to external contaminating influences, therefore, the metallic shield acts like a Faraday cage. The shield additionally has the function of a distributed or area electrode as soon as a grounded mass, for example the finger of the user approaches or touches the shield. A high-frequency signal, applied to the transmitting electrode, is then partially conducted over the finger and the body of the user to ground, so that the sensing current at the receiving electrode is clearly and unambiguously attenuated.

The change in signal current, as received by the receiving electrode, can be easily evaluated if, in accordance with a feature of the invention, the receiving electrode is connected over an amplifier and, if desired, over a flip-flop stage to a switching circuit which in turn connects a load ON and OFF. The switching arrangement can be made independent of variations in the transmitting signal if a compensating stage is provided which has two inputs, one derived directly from the transmitter and the other from the receiver. The compensating element may be a well-known summing or adding circuit to which the signals are applied 180° phase-shifted, so that, in effect, the adding circuit operates like a differential amplifier, comparing the two input signals and providing an output in the form of a difference signal.

The invention will be described by way of example with reference to the accompanying drawings, wherein.

Figure 1:
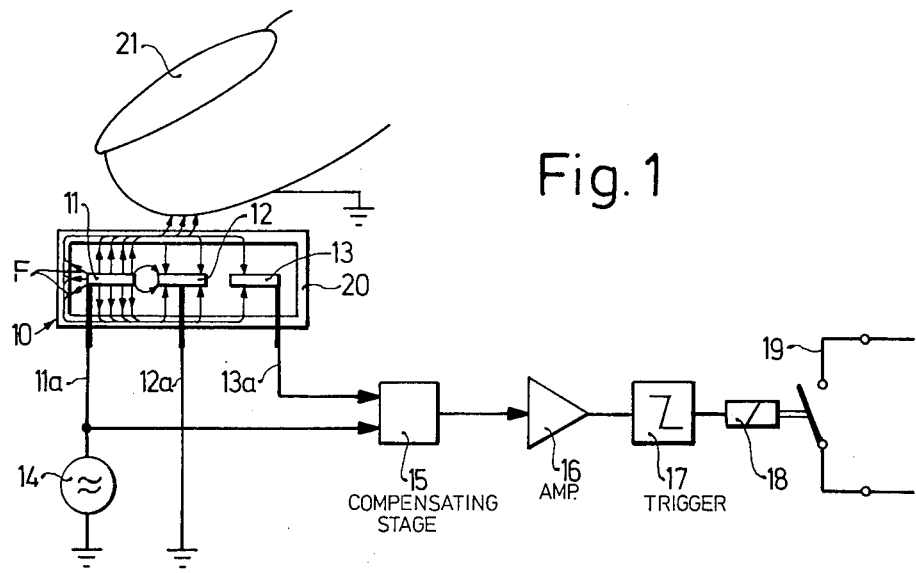
FIG. 1 is a schematic, part block circuit representation, of a capacitative sensor and an evaluation circuit connected thereto, in which the sensor is shown to an enlarged scale, and the electrodes are exaggerated.

The sensor 10 (FIG. 1) is a capacitative sensor and forms an essential feature of the system of the present invention. It is constructed as a stray, or leakage field capacitor having three plane area, or surface type electrodes 11, 12, 13 (see also FIG. 2), located in a single plane with gaps therebetween, supported on a dielectric substrate. The left area or surface electrode 11 will be referred to as the transmitting electrode; it is connected to one terminal of a high-frequency generator 14, the other terminal of which is grounded. The right electrode 13, which is the receiving electrode, is capacitatively coupled with the transmitting electrode 11. It is connected to one input of compensating stage 15. The output of stage 15 is connected through an amplifier 16 to a trigger or flip-flop stage 17, the output of which in turn is connected to a relay 18 which operates an interrupting switch in the load circuit 9 of a load connected to the network of an automotive vehicle; as an example, the circuit 19 may be the operating circuit for the horn of the vehicle. The relay 18 need not be a wire-wound relay but may be an electronic relay. A third central electrode 12 is located in the same plane as the receiving and transmitting electrodes, and connected to ground or chassis of the vehicle.

The compensating stage 15 has two inputs. One of the inputs is derived from the receiving electrodes; the other input is connected directly to the generator 14 from which the high-frequency signal is derived. The compensating stage itself includes a phase shifter, phase-shifting one of the inputs with respect to the other.

In accordance with the present invention, a metallic shield 20 surrounds the electrodes 11, 12 and 13. The metallic shield is galvanically insulated with respect to the electrodes and also with respect to ground or chassis, that is, it floats (electrically considered). Absent any grounded mass in the proximity of the shield, at least a portion of the field lines, indicated at F in FIG. 1, will be conducted by the shield 20 from the transmitting electrode 11 to the receiving electrode 13. The switch is operated when a grounded electrically conductive mass, for example the finger 21 of a user, approaches or touches the shield 20.

The sensor 10, in one construction, may be formed as a round button (FIG. 2) on which the electrodes 11, 13 are located, having an outer rounded edge matching the curvature of the sensor, surrounded by the shield 20 which is cylindrical. The upper surface of the shield 20 which has been lifted off in the illustration in FIG. 2 can be approached or touched by the user. The back side of the shield 20 is shaped to permit insulating leads 11a, 12a, 13a connected to the respective electrodes 11, 12, 13 to be carried therethrough. The planar electrodes 11, 13 have a greater area than the planar electrode 12.

Figure 2:
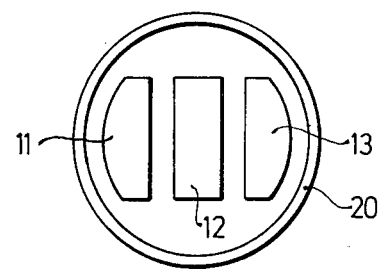
FIG. 2 is a top view, to a different scale, of three electrodes of the sensor.

Operation, with reference to FIG. 1: The high-frequency field, generated by high-frequency generator 14, causes field lines F. The generator 14 provides a signal which, preferably, is a sine wave of about 20 kHz, at an output voltage of, for example, about 35 V. The electrical field, practically, will extend between the transmitting electrode 11, the floating shield 20 on the one hand, and between the shield 20 and the center electrode 12 as well as between the receiving electrode 13, on the other. Since the metallic shield 20 has a substantially higher electric conductivity than the space between the electrodes and the shield 20, the field lines emitted from the transmitting electrode 11 will conduct the field through the shield 20 to the center electrode 12 as well as to the receiving electrode 13, respectively. Only a comparatively small proportion of leakage field will directly extend between the transmitting electrode 11 and the center electrode 12. A received signal obtained at the receiving electrode 13 will have a voltage of about 1 V; the current will be about 2 micro amperes. This signal is applied to one input of the compensating stage 15. The second input signal, derived directly from the generator 14, is phase-shifted in the compensating stage and compared with the signal derived from electrode 13. The resulting difference signal is applied to the signal amplifier 16 and hence to the trigger or flip-flop stage 17. The trigger stage 17 is so adjusted that no signal is derived from its output when the input signals have their respective values under quiescent conditions. The relay 18 thus remains OFF.

If the tip of a finger 21 of a user, or any other grounded mass, approaches the shield 20 then the relatively large-area approach of the grounding mass, or touching of the grounding mass by an electrically conductive grounded mass of the shield 20 will draw off a portion of the field from the shield 20 towards the outside and to the finger. If the finger of the user does not touch the shield, a further capacity coupling of the entire body of the user will close the circuit to ground or chassis of the vehicle. The capacity of the finger with respect to the shield 20 may, for example, be about 30 pF. Drawing off a portion of the field from the shield causes attenuation of the received signal at the receiving electrode; the voltage thereat will drop to about 0.3 V. The output signal derived from the compensating stage 15, again forming the difference between transmitted and received signals, will become greater and amplifier 16 will provide an increased input signal which will trigger the flip-flop 17 which, in turn, will operate relay 18 to close the circuit 19. The circuit is so arranged that under quiescent condition the capacitive coupling of the shield 20 with the chassis of the vehicle is insufficient to substantially attenuate the signal reaching the receiving electrode 13, but permitting, upon touching of the shield 20 by a user (even if the user were to wear a glove) dropping of the output voltage at the receiving electrode 13 to a value of 0.7 V, or less; the circuit may be set to respond to a drop in output below a predetermined threshold level, for example 0.7 V, with a normal 1 V output voltage. All values are, of course, illustrative and approximate.

Figure 3:
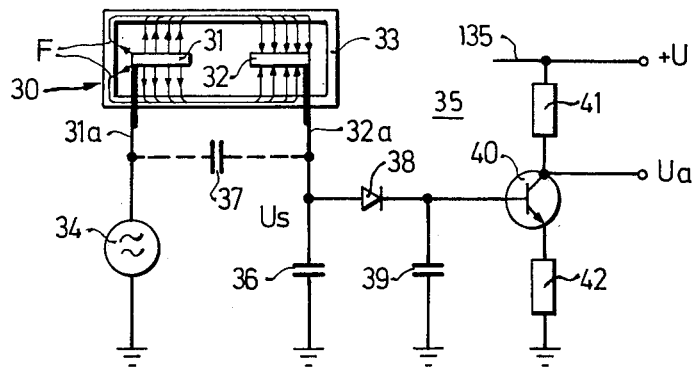
FIG. 3 is another embodiment of a sensing circuit with a capacitative sensor having two electrodes.

FIG. 3 illustrates a sensor 30 having two planar, flat electrodes arranged at a distance from each other. The electrodes 31, 32 are surrounded by an electrically floating shield 33. Transmitting electrode 31 is connected to a high-frequency generator 34. The electrodes 31, 32 are connected to leads 31a, 32a, respectively, electrically insulated from shield 33. The field lines F emitted from the transmitting electrode 31 are practically entirely conducted to the electrically floating shield 33 and transmitted by the shield to the receiving electrode 32. Receiving electrode 32 is directly connected to a circuit 35 which is a combined amplifier and trigger circuit. The input of amplifier 35 is coupled by a capacitor 36 of, for example, about 1.5 pF to ground. Upon approaching or touching of shield 33, a substantial portion of the field is drawn off from the outside of the shield to ground or chassis, so that a substantial change of the received signal will be sensed at the receiving electrode 32. This change is amplified and used directly as a control signal.

Capacitor 36 can be replaced by a resistor of about 1 meg ohms. Together with the connecting or terminal capacity of the sensor, shown as the equivalent capacity 37, a voltage divider is formed, the alternating voltage of which is the signal voltage Us which is rectified by a diode 38 and applied as a pulsating d-c voltage to a capacitor 39, where it is smoothed. The capacitor 39, as well as the cathode of diode 38, are connected to the base of an npn transistor 40. The collector of transistor 40 is connected over a resistor 41, which is relatively large, to the positive supply connection +U, indicated as bus 135; the emitter of transistor 40 is connected over a relatively small resistor 42 to ground or chassis.

Operation: The d-c voltage, smoothed by capacitor 39, is conducted to the base of transistor 40; transistor 40 will switch into conductive state, so that the output voltage Ua at the collector of transistor 40 is close to the voltage of chassis or ground, that is, is close to zero. Upon approaching or touching of the sensor with a grounded mass, the signal voltage Us will drop at the receiving electrode 32 to such an extent that the smoothed voltage conducted by capacitor 39 to the base of transistor 40 will no longer be sufficient to hold the transistor 40 in conductive state. Transistor 40 will, therefore, switch over to blocked condition and the output voltage Ua will rise to almost the voltage of the supply bus 135. The transistor 40, in this embodiment, operates both as an amplifier as well as the trigger or threshold stage. The output voltage Ua can be used directly to control switching operations.

Various changes and modifications may be made and the invention is not restricted to the embodiments described. The dimensions of the electrodes, the shielding of the sensor, as well as the evaluation and sensing circuits are subject to wide variations and changes. For example, the surfaces of the planar electrodes, and the configuration of the shield of the capacitive sensor may have any desired shape; the sensor can be built to be responsive to approach by grounded masses while they are still spaced from the sensor by a substantial distance. Thus, the sensor can be used, for example, to sense the presence of other automotive vehicles. When placed, for example, on the bumper of a vehicle, it can be used as a proximity sensor to facilitate parking of automobiles. The evaluation circuit connected to the sensor may have various forms; for example, rather than using a signal amplifier, a bridge circuit can be used. The trigger stage can be replaced by a standard flip-flop, which is bistable, for example in order to connect a circuit when the sensor is approached and, upon a subsequent approach, to disconnect the circuit. Such an arrangement may be used as a sequential ON-OFF switch, for example to control headlights, high-low beam switching, or the like, of automotive vehicles. The relays controlled by the switch can be simple relays or stepping relays, and may include electronic switches such as transistors, semiconductor thyristors, or the like. The present invention is specifically directed to shielding the electrodes by an electrically conductive shield which is galvanically insulated from the electrodes of the sensor, and which is so located with respect to the electrodes that, when the shield is not touched, or no grounded mass is close thereto, at least a portion of the field emitted from the transmitting electrode is accepted by and conducted to the receiving electrode by the shield. Upon approach of the shield by a conductive mass, at least a portion of the field is drawn off from the shield.

Various other changes and modifications may be made within the scope of the inventive concept. It is not necessary that the electrodes are in a straight, flat plane, but they may be curved; the term "planar" electrode refers to an area-type electrode which extends over a surface which may be flat, or somewhat cylindrical or spherical, for example.

We claim:

1. Capacitative proximity sensing system comprising a leakage field capacitor having a support and two adjacently located planar surface electrodes (11, 13, 31, 32) located on the surface of the support;
a signal source (14) having one terminal connected to one of the electrodes (11, 31) whereby said one electrode will be a transmitting electrode;
a receiving and evaluation circuit (15–18; 35, 36–42) having one terminal connected to the other electrode (13, 32) whereby said other electrode will be a receiving electrode, said receiving and evaluation circuit evaluating disturbances of the field being emitted by the transmitting electrode;
the other terminal of said signal source being connected to a common ground or chassis connection;
and an electrically floating metallic shield (20, 33) galvanically insulated from said electrodes and from said ground or chassis connection, said shield being located with respect to the electrodes to draw off a portion of the field generated by the transmitting electrode, when in oscillatory state, whereby, when a grounded mass approaches said floating shield, the leakage field drawn off by said shield will increase and thus provide a signal at the receiving electrode sensing proximity of the mass, said signal being evaluated in the evaluation circuit.

2. System according to claim 1, further comprising a third center electrode (13) located between the transmitting electrode (11) and the receiving electrode (13), said center electrode being connected to ground or chassis and located on said surface, said center electrode being galvanically insulated from the transmitting electrode (11), the receiving electrode (13) and the shield (20).

3. System according to claim 2, wherein the surface areas of the transmitting electrode (11) and of the receiving electrode (13), respectively, is larger than the surface area of the center electrode (12).

4. System according to claim 1, wherein the electrodes are located in an essentially common plane.

5. System according to claim 1, wherein the electrodes (11, 13) are located within a circular confine, the shield (20) is a cylindrical structure having a closed end face subject to being approached, or touched by the grounded mass, the electrodes (11, 13) having an outer configuration concentric with the cylindrical form of the cylindrical shield, and insulated leads (11a, 13a) being carried through the back side of the shield.

6. System according to claim 1, wherein the evaluation circuit comprises an amplifier and a trigger switching circuit.

7. System according to claim 6, wherein a difference stage is provided having two inputs, one input being connected to the receiving electrode and one input being connected to the signal source to form a difference signal, the change in difference signal being evaluated by the trigger stage.

8. System according to claim 5, wherein the evaluation circuit comprises a rectifier (38) and a smoothing element (39) connected to the output thereof, and a transistor (40) having its base connected to said output and operating as a combined amplifier-trigger stage.

* * * * *